United States Patent
Lu et al.

(10) Patent No.: US 8,338,819 B2
(45) Date of Patent: Dec. 25, 2012

(54) SURFACE PLASMON ENHANCED LIGHT-EMITTING DIODE

(75) Inventors: Cheng-Hsueh Lu, Pintung (TW); Chia-Chun Lan, Rende Township, Tainan County (TW); Chuan-Pu Liu, Tainan (TW)

(73) Assignee: National Cheng Kung University, Tainan (TW)

( * ) Notice: Subject to any disclaimer, the term of this patent is extended or adjusted under 35 U.S.C. 154(b) by 128 days.

(21) Appl. No.: 12/803,693

(22) Filed: Jul. 1, 2010

(65) Prior Publication Data
US 2011/0233514 A1 Sep. 29, 2011

(30) Foreign Application Priority Data
Mar. 24, 2010 (TW) ................ 99108687 A

(51) Int. Cl.
*H01L 29/06* (2006.01)
*H01L 31/00* (2006.01)

(52) U.S. Cl. .............. 257/13; 257/79; 257/E33.005

(58) Field of Classification Search ............ 257/98, 257/E33.005, 79, 13
See application file for complete search history.

(56) References Cited

U.S. PATENT DOCUMENTS
2009/0267092 A1 * 10/2009 Fukshima et al. .......... 257/98
* cited by examiner

*Primary Examiner* — William D Coleman
(74) *Attorney, Agent, or Firm* — Kilpatrick Townsend & Stockton LLP

(57) ABSTRACT

A surface plasmon enhanced light-emitting diode includes, from bottom to top, a substrate, an n-type semiconductor layer, a light-emitting layer, a p-type semiconductor layer, and a plurality of metal filler elements. The p-type semiconductor layer includes upper and lower surfaces, and the upper surface is recessed downward to form a plurality of spaced apart recesses for receiving the metal filler elements, respectively.

7 Claims, 4 Drawing Sheets

SURFACE PLASMON ENHANCED LIGHT-EMITTING DIODE

CROSS-REFERENCE TO RELATED APPLICATION

This application claims priority to Taiwanese Application No. 099108687, filed Mar. 24, 2010, the disclosure of which is incorporated herein by reference.

BACKGROUND OF THE INVENTION

1. Field of the Invention

This invention relates to a light-emitting diode, more particularly to a surface plasmon enhanced light-emitting diode by virtue of coupling with surface plasmons.

2. Description of the Related Art

It is well known that a light-emitting diode (LED) can have an enhanced light-emitting efficiency by coupling surface plasmons with quantum wells in a light-emitting layer (having a multiple quantum well structure) of the LED. The surface plasmons are coherent electron oscillations excited on the metal surface by an electromagnetic wave of light and propagate along a direction parallel to the metal surface in a form of surface electromagnetic wave, the electromagnetic field strength of which is reduced exponentially. The surface electromagnetic waves of the surface plasmons are provided with properties similar to those of evanescent waves and belong to one kind of plane waves.

In general, there are two kinds of metallic structures capable of being excited by and coupled with an incident electromagnetic wave to induce the surface plasmons. One structure is a metal layer formed with a periodically microstructure. The other structure is a metal layer having a material with a relatively high dielectric constant formed thereon. Two conventional light-emitting diodes, both of which are formed with nano-scale metallic structure to induce surface plasmons, are described in the following.

A surface plasmon enhanced LED has been proposed by Min-Ki Kwon et al., "Surface-plasmon-enhanced Light-emitting diodes," Advanced materials (2008), vol. 20, pages 1253-1257. In the surface plasmon enhanced LED, an Ag nanoparticle layer is inserted between an n-GaN layer and a light-emitting layer of a multiple quantum well (MQW) structure to induce surface plasmons therebetween. However, since epitaxial layers, such as a light-emitting layer and a p-GaN layer, are formed after the Ag nanoparticle layer is formed on the n-GaN layer (also an epitaxial layer), they are not sequentially formed in a continuous epitaxial process on the n-GaN layer but are formed on a heterogeneous material of Ag. Furthermore, in practice, the quantity of Ag nanoparticles in the Ag nanoparticle layer is insufficient to form a continuous layer. Accordingly, the Ag nanoparticle layer is uneven, and the quality of the epitaxial layers that are formed above the heterogeneous material (Ag) is relatively poor. Thus, in this case, it is likely to adversely affect the light-emitting efficiency of the LED.

Another surface plasmon enhanced LED has been proposed by Dong-Ming Yeh et al., "Localized Surface Plasmon-induced Emission Enhancement of a Green Light-emitting diode," Nanotechnology 19 (2008), p. 345201. The green LED is formed with an Ag layer with Ag nano-island structures on a p-GaN layer in a relatively high density. However, an effective area on the p-GaN layer for light emitting from a light-emitting layer is blocked and limited by the high density of the Ag nano-island structures. On the other hand, in order to ensure that the surface plasmons induced by the Ag nano-island structures can couple with quantum wells in the MQW structure of the light-emitting layer, a thickness of the p-GaN layer, i.e., a distance between the light-emitting layer and the Ag nano-island structures, is limited (e.g., 60 nm), in consideration of the skin depth of the surface plasmons. However, for providing a p-n junction of the LED in an effective operation, it is necessary to maintain a sufficient width of a depletion region in the LED. In this case, the p-GaN layer of 60 nm is insufficient for maintaining the sufficient width of the depletion region required for a well-operated LED.

SUMMARY OF THE INVENTION

Therefore, an object of the present invention is to provide a surface plasmon enhanced light-emitting diode, in which the epitaxial layers can be formed in a good quality, in which the effective areas that are not blocked by metal nanostructures on a p-type semiconductor layer can be increased, and in which the light-emitting efficiency can be improved.

Accordingly, a surface plasmon enhanced light-emitting diode of the present invention comprises, from bottom to top, a substrate, an n-type semiconductor layer, a light-emitting layer, a p-type semiconductor layer, and a plurality of metal filler elements. The p-type semiconductor layer includes upper and lower surfaces, and the upper surface is recessed downward to form a plurality of spaced apart recesses for receiving the metal filler elements, respectively.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
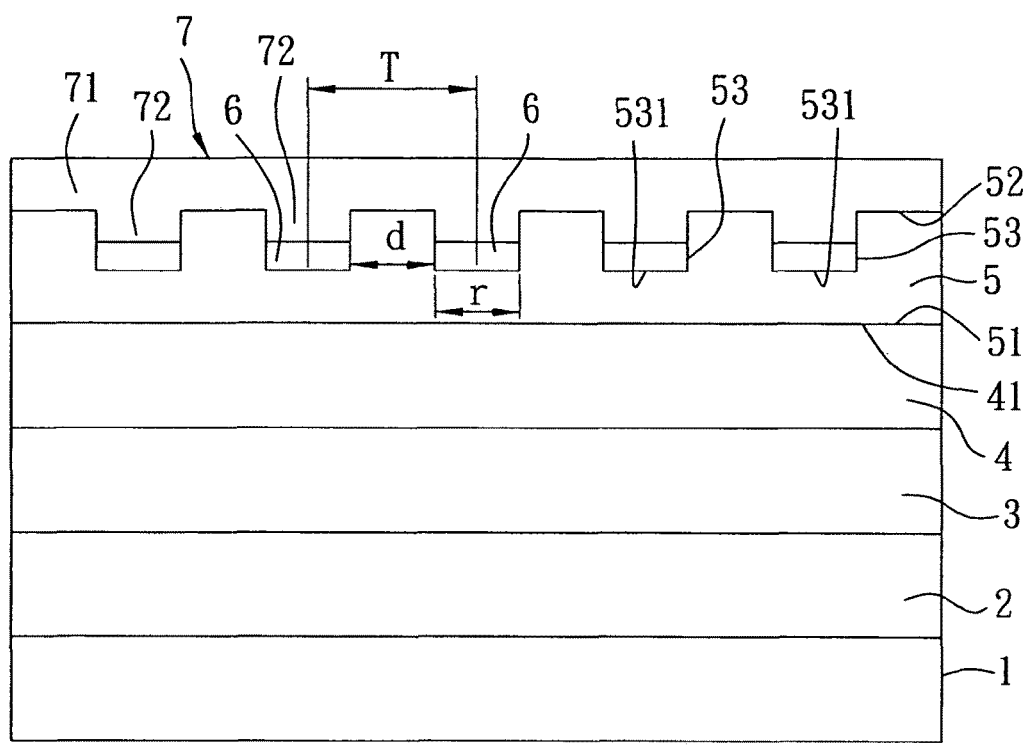
FIG. 1 is a schematic diagram of the first preferred embodiment of a surface plasmon enhanced light-emitting diode according to the present invention.

Before the present invention is described in greater detail with reference to the accompanying preferred embodiments, it should be noted herein that like elements are denoted by the same reference numerals throughout the disclosure.

Referring to FIG. 1, a surface plasmon enhanced light-emitting diode (LED) of the first preferred embodiment of the present invention includes, from bottom to top, a substrate 1, a nucleation layer 2, an n-type semiconductor layer 3, a light-emitting layer 4, a p-type semiconductor layer 5, a plurality of metal filler elements 6, and an electrode-contacting layer 7.

In this preferred embodiment, the substrate 1 is a sapphire substrate ($Al_2O_3$), and the nucleation layer 2 is made of a GaN material and covers a surface of the substrate 1. The n-type semiconductor layer 3 is made of an n-doped GaN material, and covers a surface of the nucleation layer 2. The light-emitting layer 4 has an upper surface 41, facing the p-type semiconductor layer 5, for emitting light therefrom. The light-emitting layer 4 includes multiple layers, each of which is made of one of a series of GaN materials, in a form of a stack to form a multiple quantum well (MQW) structure. In the MQW structure, electrons can combine with holes to produce photons and to emit light. In this embodiment, the emitted light has a wavelength of about 460 nm. It should be noted that, in the light-emitting layer 4 of the present invention, the wavelength of the light, the structure, and the number of the multiple layers should not be limited as long as the light-emitting layer 4 can emit light.

The p-type semiconductor layer 5 is made of a p-doped GaN material and covers the upper surface 41 of the light-emitting layer 4. The p-type semiconductor layer 5 includes lower and upper surfaces 51, 52. The lower surface 51 is connected to the upper surface 41 of the light-emitting layer 4. The upper surface 52 is recessed downward to form a plurality of spaced apart recesses 53. Each of the recesses 53 in the p-type semiconductor layer 5 has a recess bottom 531 above the upper surface 41 of the light-emitting layer 4. In order to satisfy the requirement of electrical property of a light emitting diode, the p-type semiconductor layer 5 is required to have a thickness greater than a predetermined value. Preferably, the thickness of the p-type semiconductor layer 5 ranges from 120 nm to 250 nm. In one preferred embodiment, the p-type semiconductor layer 5 has a thickness of 140 nm, each of the recesses 53 has a depth of 100 nm, and the distance between the recess bottom 531 of each of the recesses 53 and the upper surface 41 of the light-emitting layer 4 is 40 nm.

In this embodiment, the recesses 53 are periodically arranged and have a periodic interval (T), i.e., a distance between center points of two adjacent recesses 53, of 400 nm. Each of the recesses 53 has a section in a form of a circle and the circular section has a diameter (r) that is one-half of the periodic interval (T), i.e., 200 nm. A minimum distance (d) between two adjacent recesses 53 is 200 nm (d=T/2). Of course, the section of the recesses 53 can be formed in any shape, such as square, triangle, polygons, etc.

In this preferred embodiment, the metal filler elements 6 are made of silver (Ag), and are respectively received in the recesses 53 of the p-type semiconductor layer 5. Each of the metal filler elements 6 has a thickness of about 25 nm. A distance between a bottom surface of each of the metal filler elements 6 and the upper surface 41 of the light-emitting layer 4 is equal to the distance between the recess bottom 531 of each of the recesses 53 and the upper surface 41 of the light-emitting layer 4, and is 40 nm.

In this preferred embodiment, the electrode-contacting layer 7 is a transparent conductive layer made of indium tin oxide (ITO) for electrically connecting the p-type semiconductor layer 5 to a p-electrode (not shown). The electrode-contacting layer 7 includes a main portion 71 and a plurality of protrusions 72. The main portion 71 is connected to and covers entirely the upper surface 52 of the p-type semiconductor layer 5. The protrusions 72 respectively project into the recesses 53 of the p-type semiconductor layer 5 from the main portion 71 and contact the metal filler elements 6.

When making the first preferred embodiment of the surface plasmon enhanced LED of this invention, the nucleation layer 2, the n-type semiconductor layer 3, the light-emitting layer 4, and the p-type semiconductor layer 5 are sequentially formed on the substrate 1 by using a metal organic chemical vapor deposition (MOCVD) process. Then, the recesses 53 are formed in the p-type semiconductor layer 5 by using an E-beam lithography process followed by an inductively coupled plasma-reactive ion etching process. The details for forming the recesses 53 are omitted since the forming of recesses in a semiconductor layer are well-known in the art. Thereafter, a silver layer (not shown) is formed on the p-type semiconductor layer 5 by using a vapor deposition process so that some silver material fills in the recesses 53 to form the metal filler elements 6. The silver layer formed on the upper surface 52 of the p-type semiconductor layer 5 is then removed. Finally, the electrode-contacting layer 7 is deposited on the p-type semiconductor layer 5, and some material of the electrode-contacting layer 7 will be filled into the recesses 53 to form the protrusions 72.

A mechanism concerning the improvement of the light-emitting efficiency by coupling of surface plasmons will be explained in the following description.

It is known that electrons and holes can combine with each other to release energy as light, heat or surface plasmons. Since the metal filler elements 6 constitute a periodic metal structure that can be provided with a wave vector for the electromagnetic wave of the light emitted from the light-emitting layer coupling with the surface plasmons, the energy released from the combination of carriers (electrons and holes) in the light-emitting layer 4 can be coupled to the surface plasmon mode. That is, the energy released from the combination of carriers in the light-emitting layer 4 can be converted to the surface plasmons and simultaneously the energy of surface plasmons can be converted to light. Since the surface plasmons have a relatively high density of energy state, the surface plasmons couple with the quantum wells in the MQW structure of the light-emitting layer 4 at a faster rate than that of the carriers releasing energy in the form of heat. Accordingly, by the coupling mechanism of the surface plasmons, the carriers can release energy in the form of light through a relatively fast route, and the energy released in the form of heat can be inhibited, thereby enhancing the light-emitting efficiency of the LED of the present invention.

Figure 2:
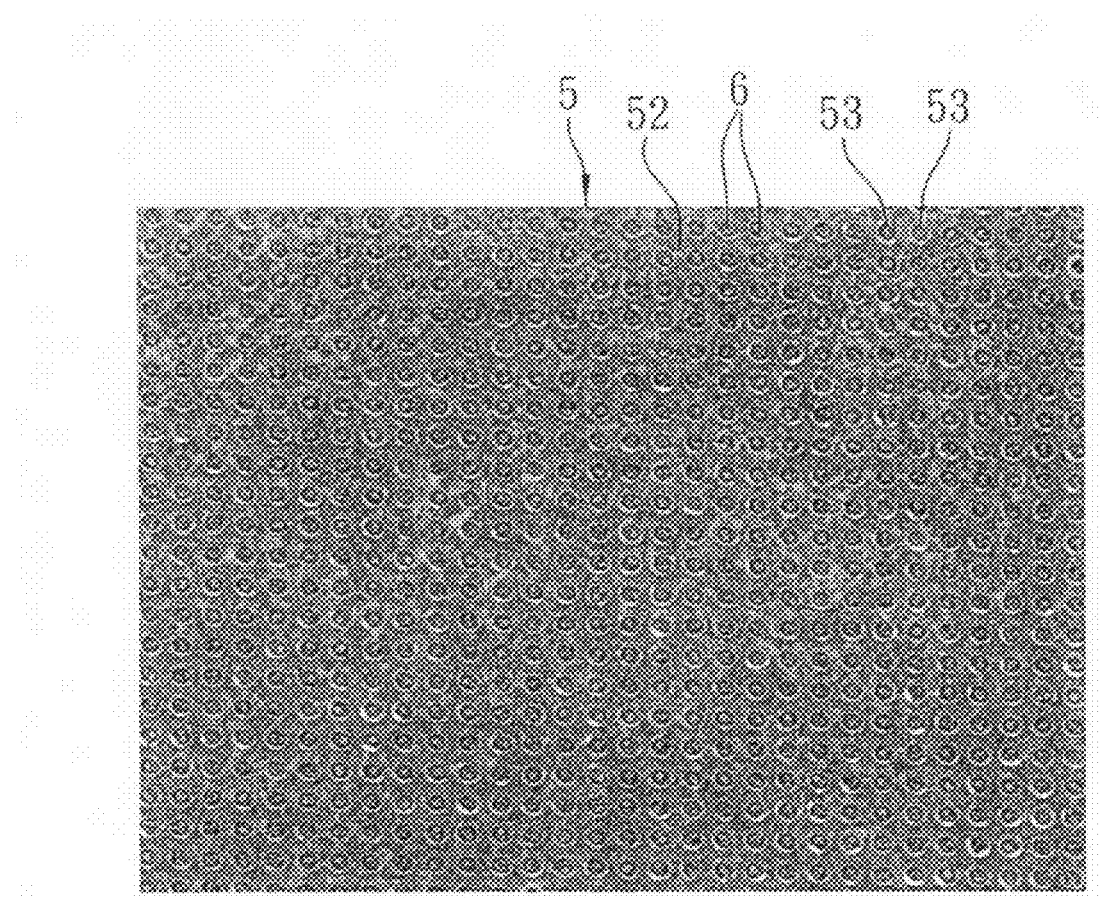
FIG. 2 is a scanning electron microscope photograph of the first embodiment of this invention for illustrating metal filler elements received in recesses of a p-type semiconductor layer.
Figure 3:
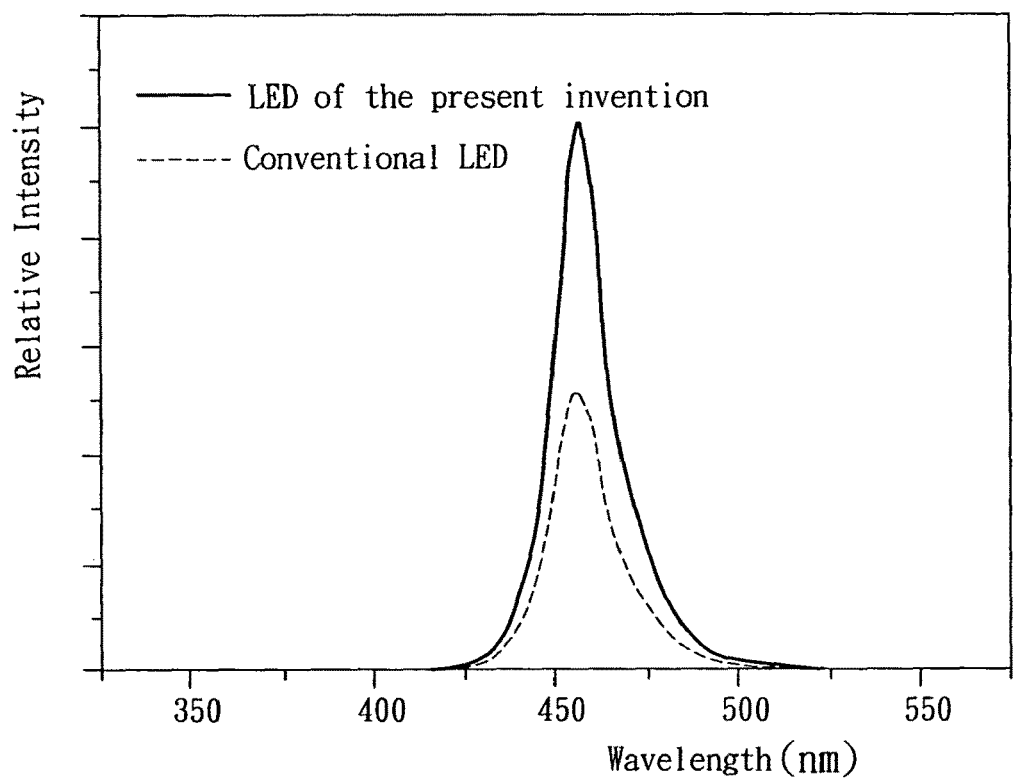
FIG. 3 is a photoluminescence spectrum of the first embodiment of the surface plasmon enhanced LED of this invention and a conventional LED.

FIG. 2 is a scanning electron microscope photograph of the first embodiment for illustrating the metal filler elements 6 received in the recesses 53 of the p-type semiconductor layer 5. FIG. 3 is a photoluminescence spectrum of the LED of the first embodiment and a conventional LED (without the metal filler elements 6). It is evident that the LED of the present invention can provide a relatively high intensity, i.e., a relatively high light-emitting efficiency.

Note that the material of the metal filler elements 6 may be chosen according to a wavelength of the light emitted from the LED. The material of the metal filler elements 6 may be selected from silver, gold, aluminum, platinum, gallium, or combinations thereof. In general, the metal filler elements 6 are made of silver when used in a blue light LED, are made of gold when used in a green light LED, and are made of aluminum when used in a UV light LED. That is because the frequency of surface plasmon resonance depends on the dielectric constant of the metal filler elements 6. Therefore, when the wavelength of the light emitted from the LED matches with the frequency of surface plasmon resonance, the maximum enhancement of light-emitting efficiency can be achieved. In this invention, since the LED (GaN) emits light in the wavelength of about 460 nm, and since the oscillation frequency of the surface plasmons having energy of 2.7 eV at an interface between silver and GaN materials matches with the wavelength of about 460 nm, the metal filler elements 6 are selected to be made of silver.

The distance between the recess bottom 531 of each of the recesses 53 and the upper surface 41 of the light-emitting layer 4 being formed as 40 nm is based on the following reason. Theoretically, the electromagnetic field strength of surface plasmons on a metal surface is reduced gradually with the increase of distance from the metal surface. For the LED emitting light having an emitting light wavelength of about 460 nm, an effective range of a near-field of the surface plasmons on the metal filler elements 6 for coupling with the light-emitting layer 4 is 42 nm. Accordingly, the distance between the bottom surface of each of the metal filler elements 6 and the upper surface 41 of the light-emitting layer 4 should be smaller than 42 nm. Of course, for the LED having other emitting light wavelengths, the effective range of a near-field of the surface plasmons on the metal filler elements 6 is not necessary limited to be 42 nm. Therefore, in practice, the distance between the recess bottom 531 of each of the recesses 53 and the upper surface 41 of the light-emitting layer 4 is required to be not greater than 100 nm and greater than 0 nm.

In summary, by forming the recesses 53 arranged periodically in the p-type semiconductor layer 5, and by respectively providing the metal filler elements 6 in the recesses 53 to constitute the periodic metal structure, the surface plasmons can be induced to couple with the quantum wells in the MQW structure of the light-emitting layer 4 so as to enhance the light-emitting efficiency of the LED of the present invention. Besides, the LED of the present invention can further provide the following advantages:

(1) The metal filler elements 6 are formed after the epitaxial layers (i.e., the n-type semiconductor layer 3, the light-emitting layer 4, and the p-type semiconductor layer 5) have been formed. That is to say, the periodic metal structure is formed after the epitaxial growth process of the epitaxial layers is completed. Therefore, forming of the metal filler elements 6 will not adversely affect the structure of epitaxial layers, and the epitaxial layers of the LED of the present invention can be formed in a good quality.

(2) The recesses 53 are formed in a case of the p-type semiconductor layer 5 being maintained in a required thickness, and thus, the p-type semiconductor layer 5 can satisfy the electrical property requirement for the LED. Furthermore, by varying the material of the metal filler elements 6 or by varying the periodic structure of the metal filler elements 6 (i.e., the period interval of the recesses 53), the other mode of surface plasmon resonance, which is in the other energy state, can be induced. Therefore, the structure of the LED according to the present invention can be applied to light-emitting diodes that emit light at different wavelengths.

(3) Since the metal filler elements 6 are formed respectively in the recesses 53, but are not formed as a continuous metal layer, the effective areas on the p-type semiconductor layer 5 for emitting light that are not blocked by the metal structure can be increased.

Figure 4:
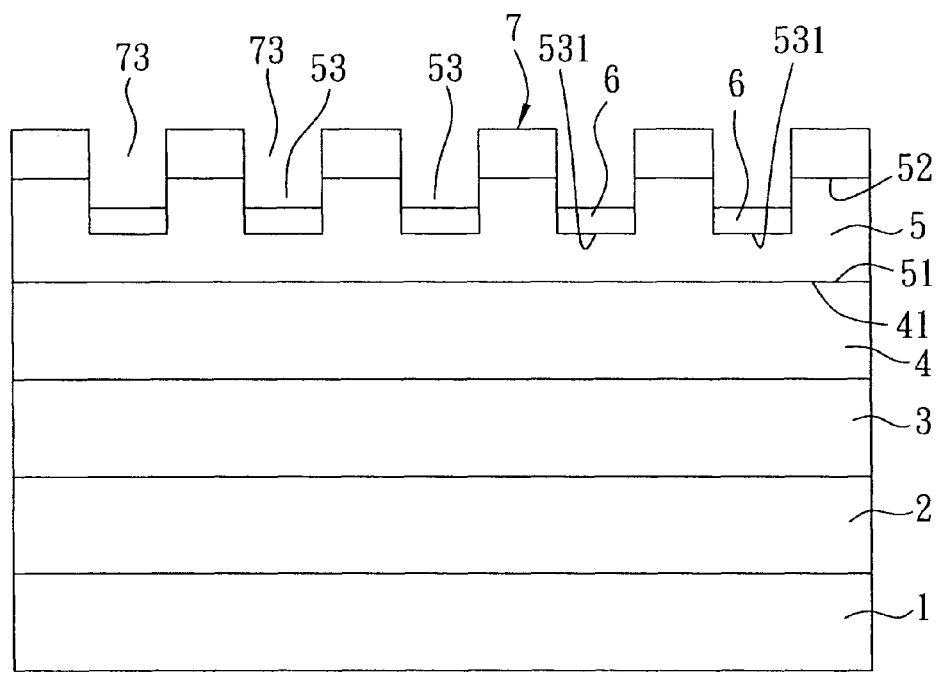
FIG. 4 is a schematic diagram of the second preferred embodiment of a surface plasmon enhanced light-emitting diode according to the present invention.

FIG. 4 illustrates the second preferred embodiment of a surface plasmon enhanced light-emitting diode (LED) according to the present invention. The second embodiment differs from the first embodiment only in that the electrode-contacting layer 7 is not formed with protrusions, but is formed with a plurality of through holes 73 respectively aligned with the recesses 53 of the p-type semiconductor layer 5.

When forming the LED of the second embodiment of the present invention, the electrode-contacting layer 7 is formed immediately after the forming of the p-type semiconductor layer 5. Then, the through holes 73 and the recesses 53 are formed by lithography and etching processes, followed by forming the metal filler elements 6 in the recesses 53. The LED of the second preferred embodiment can also enhance the light-emitting efficiency and has the same advantages as those of the first preferred embodiment.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A surface plasmon enhanced light-emitting diode, comprising, from bottom to top, a substrate, an n-type semiconductor layer, a light-emitting layer, a p-type semiconductor layer, and a plurality of metal filler elements, wherein said p-type semiconductor layer includes an upper surface and a lower surface, said upper surface being recessed downward to form a plurality of spaced apart recesses to receive said metal filler elements, respectively, and wherein a distance from a bottom surface of each of said metal filler elements to an upper surface of said light-emitting layer is smaller than a distance from said upper surface of said p-type semiconductor layer to said upper surface of said light-emitting layer.

2. The surface plasmon enhanced light-emitting diode of claim 1, wherein each of said recesses in said p-type semiconductor layer has a recess bottom above said upper surface of said light-emitting layer, and a distance between said recess bottom of each of said recesses and said upper surface of said light-emitting layer is not larger than 100 nm.

3. The surface plasmon enhanced light-emitting diode of claim 1, wherein said p-type semiconductor layer has a thickness ranging from 120 nm to 250 nm.

4. The surface plasmon enhanced light-emitting diode of claim 1, wherein each of said metal filler elements is made of a material selected from the group consisting of silver, gold, aluminum, platinum, gallium, and combinations thereof.

5. The surface plasmon enhanced light-emitting diode of claim 1, further comprising an electrode-contacting layer disposed on said p-type semiconductor layer.

6. The surface plasmon enhanced light-emitting diode of claim 5, wherein said electrode-contacting layer includes a main portion connected to and covering entirely said upper surface of said p-type semiconductor layer, and a plurality of protrusions respectively projecting into said recesses of said p-type semiconductor layer from said main portion and contacting said metal filler elements.

7. The surface plasmon enhanced light-emitting diode of claim 5, wherein said electrode-contacting layer is formed with a plurality of through holes respectively aligned with said recesses of said p-type semiconductor layer.

* * * * *